United States Patent
Watabe et al.

(10) Patent No.: US 11,271,120 B2
(45) Date of Patent: Mar. 8, 2022

(54) SOLAR CELL WITH HIGH PHOTOELECTRIC CONVERSION EFFICIENCY AND METHOD FOR MANUFACTURING SOLAR CELL WITH HIGH PHOTOELECTRIC CONVERSION EFFICIENCY

(71) Applicant: SHIN-ETSU CHEMICAL CO., LTD., Tokyo (JP)

(72) Inventors: Takenori Watabe, Annaka (JP); Ryo Mitta, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 393 days.

(21) Appl. No.: 15/753,630

(22) PCT Filed: Oct. 25, 2016

(86) PCT No.: PCT/JP2016/004690
§ 371 (c)(1),
(2) Date: Feb. 20, 2018

(87) PCT Pub. No.: WO2018/078667
PCT Pub. Date: May 3, 2018

(65) Prior Publication Data
US 2019/0157478 A1    May 23, 2019

(51) Int. Cl.
*H01L 31/0224* (2006.01)
*H01L 31/0236* (2006.01)
*H01L 31/068* (2012.01)

(52) U.S. Cl.
CPC ........... *H01L 31/022458* (2013.01); *H01L 31/02363* (2013.01); *H01L 31/022441* (2013.01); *H01L 31/0682* (2013.01); *Y02E 10/50* (2013.01)

(58) Field of Classification Search
CPC ..... H01L 31/022458; H01L 31/022441; H01L 31/02363; H01L 31/0682
See application file for complete search history.

(56) References Cited

U.S. PATENT DOCUMENTS 5,053,083 A * 10/1991 Sinton ............... H01L 31/03529
   136/255
7,339,110 B1 * 3/2008 Mulligan ............ H01L 31/1804
   136/256

(Continued)

FOREIGN PATENT DOCUMENTS

| CN | 103035779 A | 4/2013 |
| CN | 103794679 A | 5/2014 |

(Continued)

OTHER PUBLICATIONS

Mohamed et al., Comparative Study of etching silicon wafers with NaOH and KOH solutions, International Journal of Computational and Experimental Science and Engineering, vol. 1, No. 2, pp. 7-11 (Year: 2015).*

(Continued)

*Primary Examiner* — Jayne L Mershon
(74) *Attorney, Agent, or Firm* — Oliff PLC

(57) ABSTRACT

A method for manufacturing a solar cell, including the steps of: forming unevenness on both of main surfaces of a semiconductor substrate of a first conductivity type; forming a base layer on a first main surface of the semiconductor substrate; forming a diffusion mask on the base layer; removing the diffusion mask in a pattern; forming an emitter layer on the portion of the first main surface where the (Continued)

diffusion mask have been removed; removing the remaining diffusion mask; forming a dielectric film on the first main surface; forming a base electrode on the base layer; and forming an emitter electrode on the emitter layer. This provides a method for manufacturing a solar cell that can bring high photoelectric conversion efficiency while decreasing the number of steps.

11 Claims, 6 Drawing Sheets

(56) References Cited

U.S. PATENT DOCUMENTS

| | | | | |
|---|---|---|---|---|
| 8,574,951 | B1* | 11/2013 | Wang | H01L 31/02168 136/256 |
| 2007/0151598 | A1 | 7/2007 | De Ceuster et al. | |
| 2009/0039361 | A1* | 2/2009 | Li | H01L 29/205 257/94 |
| 2010/0300518 | A1* | 12/2010 | Moslehi | H01L 31/035281 136/255 |
| 2011/0180132 | A1* | 7/2011 | Dove | H01L 31/028 136/256 |
| 2011/0303280 | A1 | 12/2011 | Pawlak et al. | |
| 2013/0087192 | A1 | 4/2013 | Kim et al. | |
| 2013/0214271 | A1 | 8/2013 | Asami et al. | |

FOREIGN PATENT DOCUMENTS

| | | |
|---|---|---|
| JP | H05-299672 A | 11/1993 |
| JP | 2013-084930 A | 5/2013 |
| JP | 2014-086590 A | 5/2014 |
| JP | 2014-112600 A | 6/2014 |
| JP | 2015-106624 A | 6/2015 |
| JP | 2015-118979 A | 6/2015 |
| JP | 2015-167260 A | 9/2015 |
| JP | 2016-146471 A | 8/2016 |
| JP | 5963999 B1 | 8/2016 |
| TW | 201431108 A | 8/2014 |

OTHER PUBLICATIONS

May 9, 2019 International Preliminary Report on Patentability Issued in International Patent Application No. PCT/JP2016/004690.
Oct. 25, 2018 Office Action issued in Taiwanese Patent Application No. 106107811.
Jan. 2, 2019 Extended Search Report issued in European Patent Application No. 16897471.5.
Jul. 11, 2017 Office Action issued in Japanese Patent Application No. 2017-519704.
Dec. 27, 2016 International Search Report issued in International Patent Application No. PCT/JP2016/004690.
Feb. 12, 2020 Office Action issued in Taiwanese Patent Application No. 108113579.
Denafas. J. et al., "Implementation and Optimization of an Industrial MC-SI Pere Process for Mass Production," 31st European Photovoltaic Solar Energy Conference and Exhibition, Nov. 2, 2015, pp. 525-530.
Nov. 14, 2019 Office Action Issued in European Patent Application No. 16897471.5.
Apr. 30, 2021 Office Action issued in Indian Patent Application No. 201847016931.
Jul. 21, 2021 Office Action issued in U.S. Appl. No. 16/872,589.
Dec. 21, 2021 Office Action issued in Chinese Patent Application No. 201680090315.7.

* cited by examiner

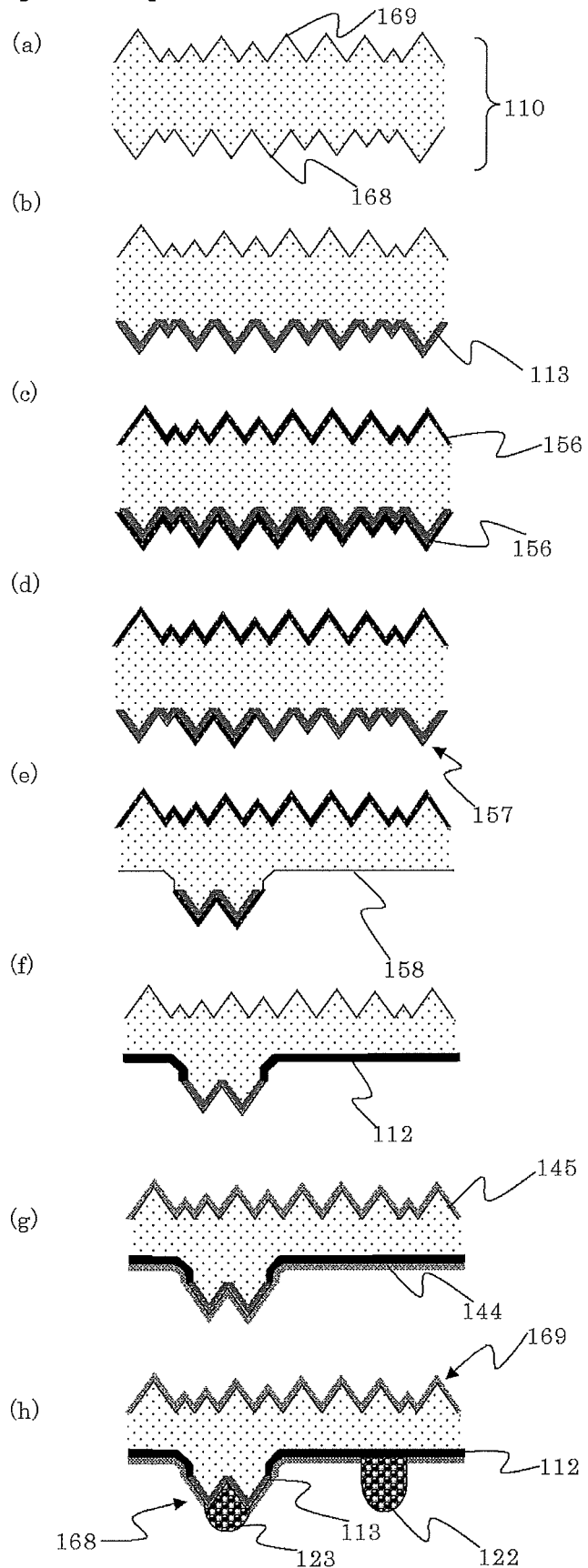
[FIG. 1]

[FIG. 2]
(a)
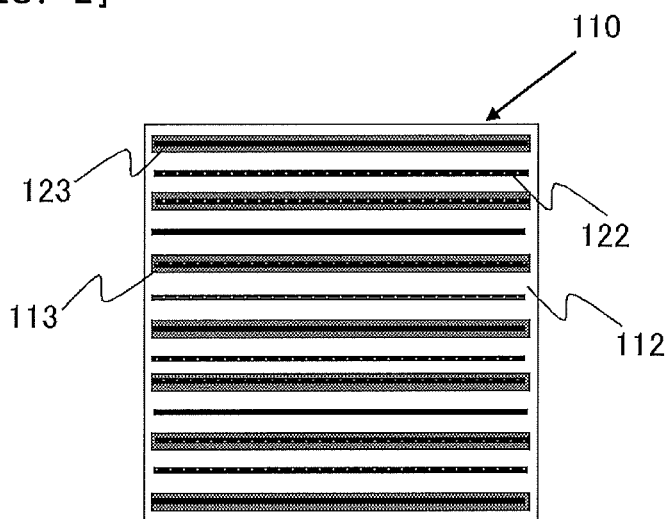
(b)
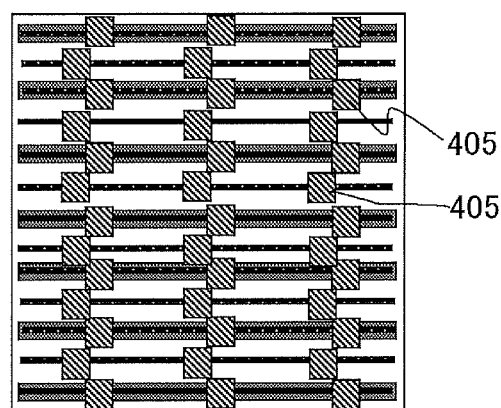
(c)
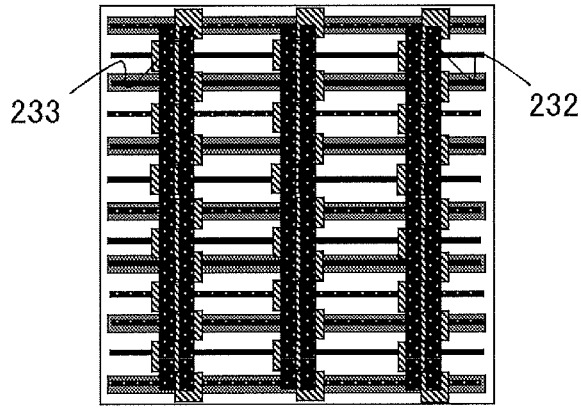

[FIG. 3]
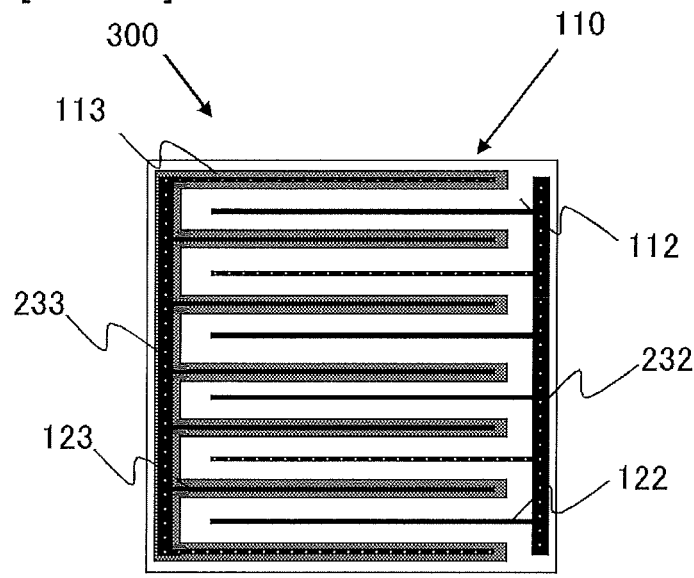
[FIG. 4]
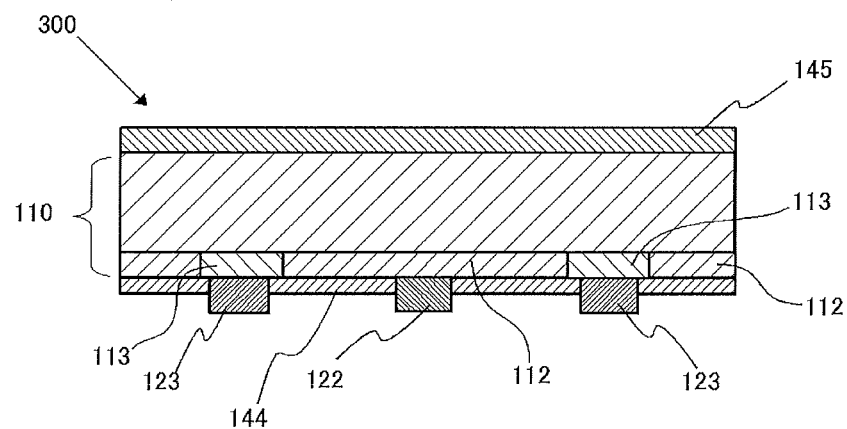
[FIG. 5]
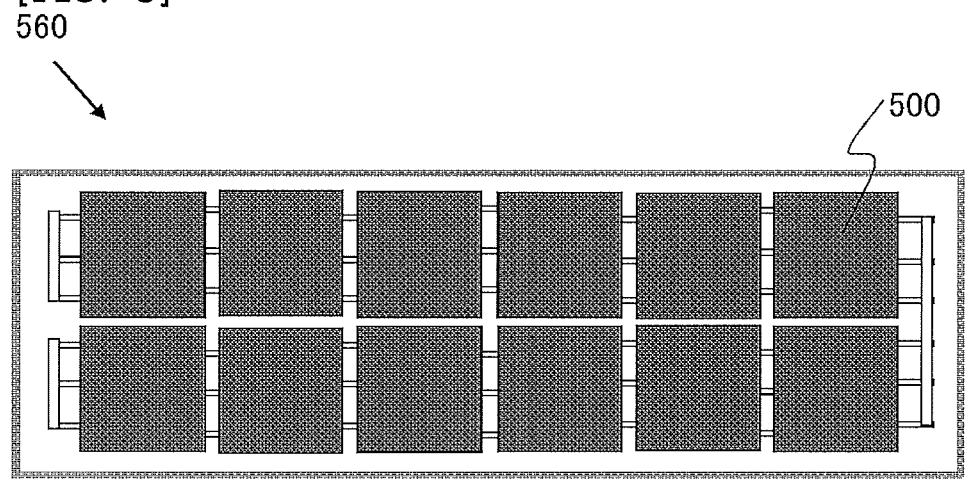

[FIG. 6]
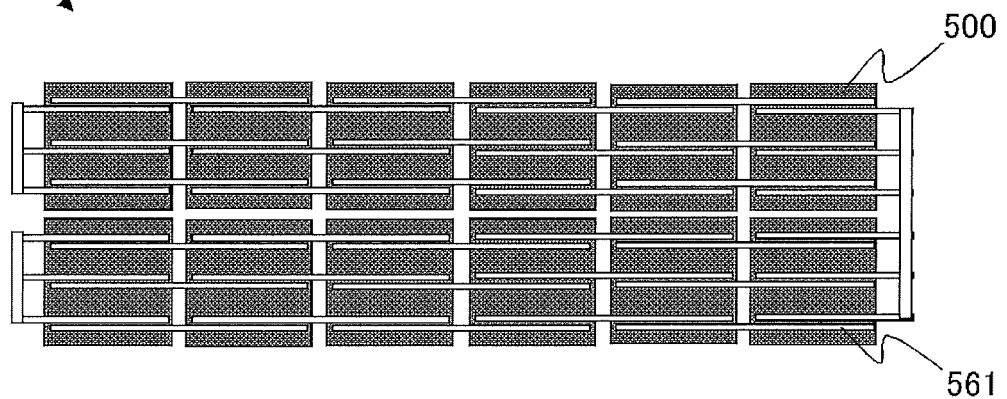
[FIG. 7]
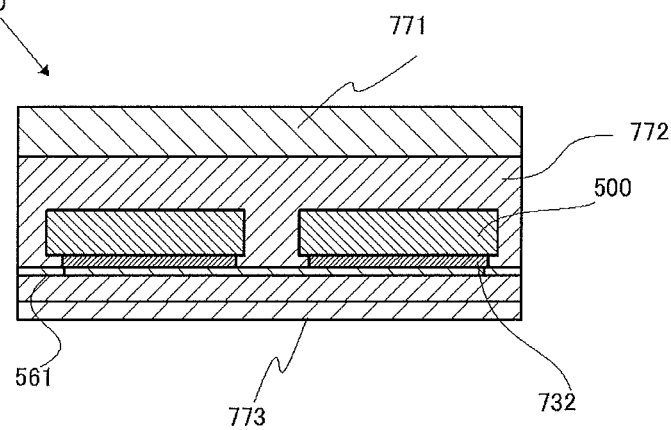
[FIG. 8]
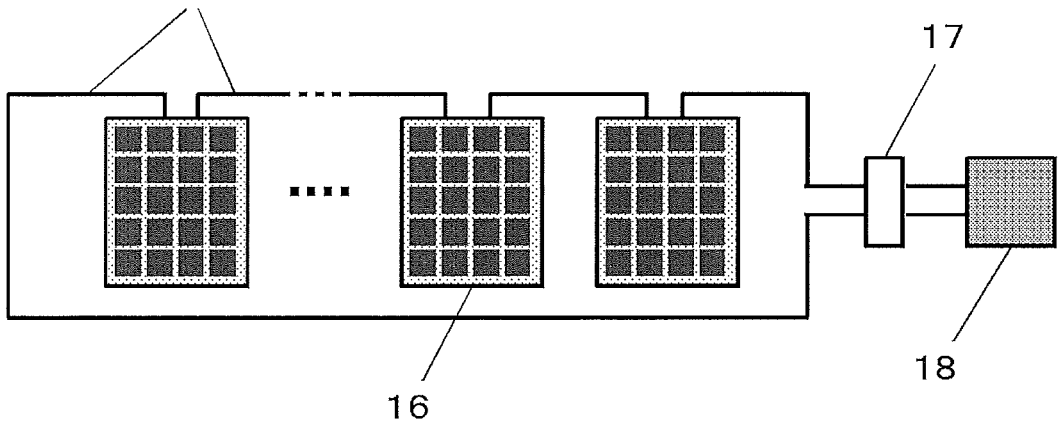

[FIG. 9]
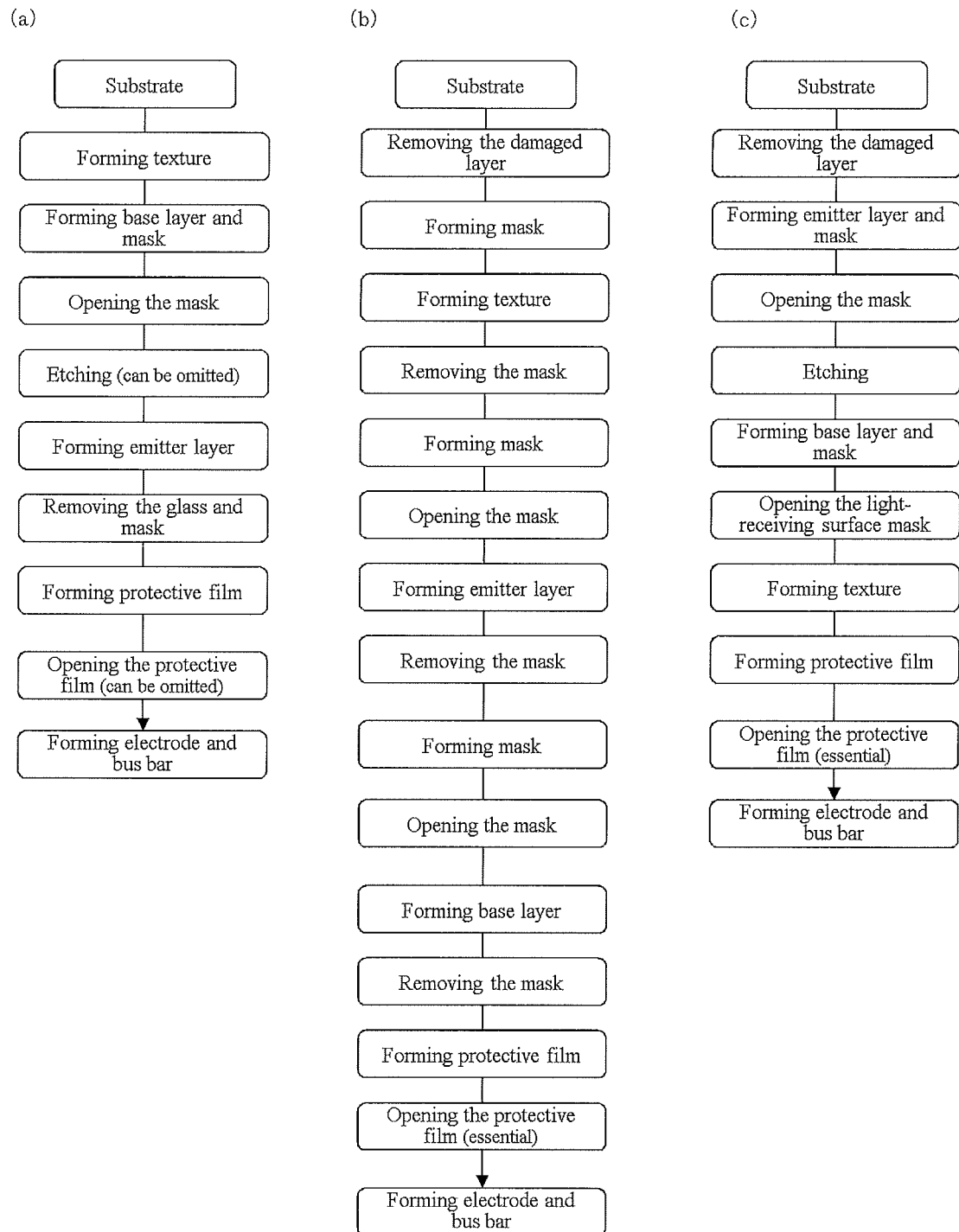

[FIG. 10]
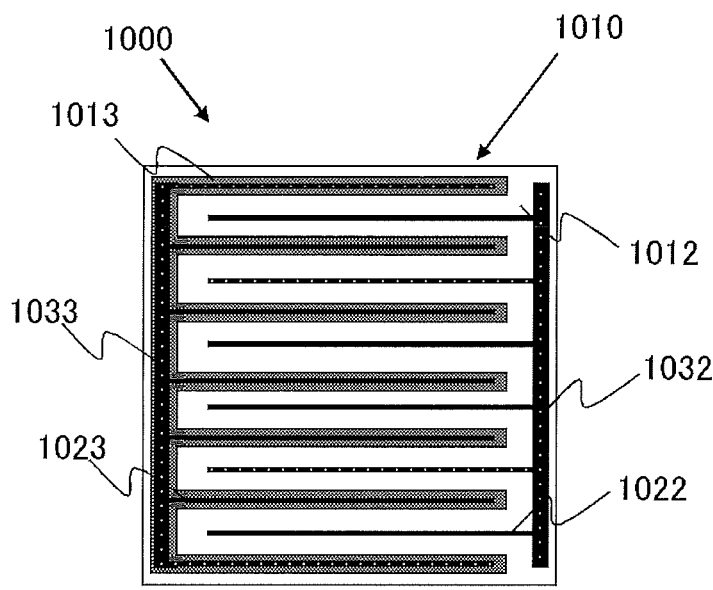
[FIG. 11]
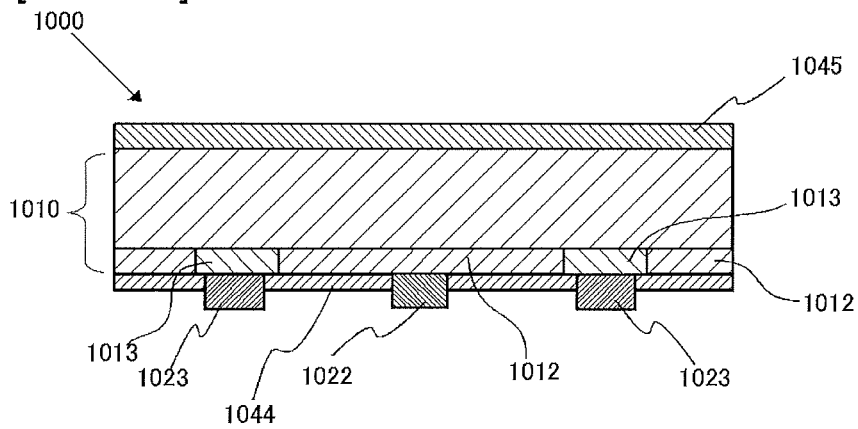

SOLAR CELL WITH HIGH PHOTOELECTRIC CONVERSION EFFICIENCY AND METHOD FOR MANUFACTURING SOLAR CELL WITH HIGH PHOTOELECTRIC CONVERSION EFFICIENCY

TECHNICAL FIELD

The present invention relates to a solar cell with high photoelectric conversion efficiency and a method for manufacturing a solar cell with high photoelectric conversion efficiency.

BACKGROUND ART

Solar cell structures with relatively high photoelectric conversion efficiency which use single crystal or polycrystalline semiconductor substrates include a back-surface-electrode-type solar cell, in which all of the positive and negative electrodes are provided on the non-light-receiving surface (the back surface). The schematic view of the back surface of the back-surface-electrode-type solar cell 1000 is shown in FIG. 10. On the back surface of the substrate 1010, the emitter layer 1012 and the base layer 1013 are disposed alternately. On each of the layers, electrodes (collecting electrodes) (the emitter electrode 1022, the base electrode 1023) are provided along the corresponding layer. The back surface is also provided with bus bar electrodes (the emitter bus bar electrode 1032, the base bus bar electrode 1033) to further collect currents obtained from the foregoing electrodes. The bus bar electrodes are at right angles to the collecting electrodes in many cases from the viewpoint of the function. The emitter layer 1012 has a width of several millimeters to hundreds of micrometers, and the base layer 1013 has a width of hundreds of micrometers to several tens of micrometers. Each of the collecting electrodes (the emitter electrode 1022, the base electrode 1023) generally has a width of several hundreds of micrometers to several tens of micrometers, and is often referred to as finger electrode.

The cross sectional structure of the back-surface-electrode-type solar cell 1000 is schematically shown in FIG. 11. The back surface of the substrate is provided with the emitter layer 1012 and the base layer 1013 formed near the outmost surface thereof. Each film thickness of the emitter layer 1012 and the base layer 1013 is about 1 μm at most. On each layer, the finger electrode 1022 or 1023 is provided. The surface of each non-electrode region (the region where the electrode is not formed) is covered with a dielectric film (the back surface protective film 1044) such as a silicon nitride film and a silicon oxide film. The solar cell 1000 is provided with the antireflection coating 1045 on the light-receiving surface to decrease the reflection loss.

Such a structure is known in Patent Document 1, which discloses an example of a method for producing the solar cell having the structure. The outline of the process flow is shown in FIG. 9(*b*). According to this process flow, on an N-type substrate, the slice damage of which have been removed, a texture mask is formed only onto the back surface first, and texture is formed only onto one side (light-receiving surface). After removing the mask, a diffusion mask is formed on the back surface and is opened in a pattern shape. The opening is subjected to diffusion of a P-type dopant such as boron, followed by removing the mask and glass formed in the diffusion with HF or the like. Subsequently, a diffusion mask is formed again and is opened, and the opening is subjected to diffusion of an N-type dopant such as phosphorus, followed by removing the mask and glass. Through the series of these steps, a base layer and an emitter layer are formed on the back surface. After that, forming of a protective layer, opening, and forming of collecting electrodes and bus bar electrodes are performed.

Patent Document 2 discloses another example of the production method. The outline of the process flow is shown in FIG. 9(*c*). In Patent Document 2, an N-type substrate, the slice damage of which have been removed, is subjected to forming of an emitter layer and a mask, opening of the mask, etching, forming of a base layer and a mask, opening of the light-receiving surface mask, forming of texture, forming of a protective film, opening of the protective film, and forming of collecting electrodes and bus bar electrodes. As described above, the method of Patent Document 2 also needs to perform the mask formation and opening step at least two times.

CITATION LIST

Patent Literature

Patent Document 1: Japanese Unexamined Patent Application publication (Kokai) No. 2015-167260
Patent Document 2: U.S. Pat. No. 7,339,110
Patent Document 3: Japanese Unexamined Patent Application publication (Kokai) No. 2015-118979

SUMMARY OF INVENTION

Technical Problem

The foregoing known methods have been regarded to have a problem of including many steps. The mask forming step and the opening step have to be performed in a pair without exception, thereby increasing the production cost. The methods include many thermal treatment steps, in which a substrate is exposed to higher temperature, causing to reduce the lifetime of the minority carriers of the substrate.

In either of the methods, texture has to be formed only at one side of a substrate, which necessitates to form a mask only at one side. This requires procedures such as forming a silicon nitride film or the like on one side, as well as forming silicon oxide films on the both sides followed by forming resist on the entire surface of the backside, and dipping the substrate to HF to remove the silicon oxide film only at the light-receiving surface, increasing not only the number of steps but also the materials to be used. These methods also have a problem that the formation of uniform mask in a substrate surface becomes difficult when the thickness of the mask is intended to be a minimum.

In either of the methods, the emitter layer and the base layer are formed, with the back surface being flattened. Accordingly, these layer become difficult to electrically connect with electrodes, increasing the contact resistance between the substrate and the collecting electrode to decrease the conversion efficiency.

Regarding these problems, Patent Document 3 discloses an effective method with relatively few steps in which electrical connection of the base layer is improved. This method, however, also includes a step to remove a silicon oxide film on the light-receiving surface alone (i.e., to form a mask only at one side), causing the problems described above.

The present invention was accomplished in view of the above-described problems. It is an object of the present invention to provide a method for manufacturing a solar cell that can bring high photoelectric conversion efficiency while decreasing the number of steps. It is also an object of the present invention to provide a solar cell in which the contact resistance is decreased to improve the photoelectric conversion efficiency.

Solution to Problem

To solve the problems described above, the present invention provides a method for manufacturing a solar cell, including the steps of:
forming unevenness on both of main surfaces of a semiconductor substrate of a first conductivity type;
forming a base layer of the first conductivity type, having a dopant concentration higher than in the semiconductor substrate, on a first main surface of the semiconductor substrate;
forming a diffusion mask on the base layer;
removing the diffusion mask in a pattern to have a remaining diffusion mask at other than a portion where the diffusion mask have been removed;
forming an emitter layer of a second conductivity type which is an opposite conductivity type to the first conductivity type, on the portion of the first main surface where the diffusion mask have been removed;
removing the remaining diffusion mask;
forming a dielectric film on the first main surface;
forming a base electrode on the base layer; and
forming an emitter electrode on the emitter layer.

The inventive method can decrease the step of forming and opening a diffusion mask to one time. In the first step, fine unevenness (e.g., texture) is formed, and it is not necessary to form a mask on only one side. In a solar cell manufactured by the inventive method, fine unevenness such as texture is formed on the base layer region (the base layer). This can decrease the contact resistance between the base layer and an electrode (i.e., the base electrode) connected therewith to improve the conversion efficiency.

It is preferable that the surface of the semiconductor substrate be subjected to etching on the portion where the diffusion mask have been removed after the step of removing the diffusion mask in a pattern and before the step of forming the emitter layer.

The conversion efficiency can be improved by forming the emitter layer after etching the base layer of the opening (the portion where the mask have been removed) as described above.

After forming the emitter layer, the film thickness of a silicon oxide film on the emitter layer can be 95 nm or less.

In the inventive method, the mask formation is not necessary after forming the emitter layer, and it is not necessary to form silicon oxide after forming the emitter layer.

It is preferable that the first conductivity type be P-type, and the second conductivity type be N-type; in the step of forming the base layer, a glass layer be formed on the first main surface simultaneously with forming the base layer; and in the step of forming the diffusion mask, the diffusion mask be formed on the base layer with the glass layer being left.

The minority carrier lifetime of the substrate can be kept high by forming the diffusion mask while leaving the glass layer formed simultaneously with forming a P-conductivity type layer as the base layer.

It is also appropriate that the first conductivity type be P-type, and the second conductivity type be N-type; and the base electrode and the emitter electrode be formed after forming the dielectric film without removing the dielectric film.

Forming the P-type base layer on the portion where the texture have been formed makes it possible to realize lower contact resistance between the base (P-type) layer and the collecting electrode without opening the dielectric film.

It is also preferable that the first conductivity type be N-type, and the second conductivity type be P-type; and the step of forming the dielectric film be a step of forming an aluminum oxide film to cover the base layer and the emitter layer and forming a silicon nitride film on the aluminum oxide film.

In back-surface-electrode-type solar cells, most of the back surfaces are normally emitter layers. When the emitter layer is P-type, high photoelectric conversion efficiency can be given in a convenient way by covering the back surface with an aluminum oxide film, which is effective as P-type passivation.

In the step of forming the base layer, the base layer is preferably formed on an entire surface of the first main surface.

Such a method for manufacturing a solar cell can easily manufacture a solar cell in which the base layer and the emitter layer are contiguous to each other.

It is preferable that the unevenness be texture.

Such a method for manufacturing a solar cell shows higher productivity.

The present invention also provides a solar cell including:
a semiconductor substrate of a first conductivity type;
a base layer of the first conductivity type, having a dopant concentration higher than in the semiconductor substrate, and an emitter layer of a second conductivity type, being an opposite conductivity type to the first conductivity type, each of the layer being provided on a first main surface of the substrate;
a dielectric film provided on the base layer and the emitter layer;
a base electrode electrically connected with the base layer; and
an emitter electrode electrically connected with the emitter layer;
wherein, a surface of the semiconductor substrate is provided with unevenness formed at least at the contact interface between the base electrode and the base layer; and
the first main surface has a recess in a pattern, with the surface of the recess being flat, and the emitter layer is formed on the surface of the recess.

By forming the fine unevenness (e.g., texture) on the portion being in contact with the electrode of the base region as described above, it is possible to realize lower contact resistance between the base layer and the collecting electrode without opening the dielectric film. As a result, the contact resistance can be decreased to make the solar cell have improved photoelectric conversion efficiency. As described above, the inventive solar cell also has an emitter region, the surface of which is recessed from its surroundings, with the surface being flat. The flat surface decreases the rate of re-combination of minority carriers on the surface, which contributes to improve the photoelectric conversion efficiency. It is to be noted that such a structure can be produced by removing the diffusion mask in a pattern and etching the base layer at a portion where the mask have been removed, followed by forming the emitter layer as described above.

It is preferable that the first conductivity type be N-type, and the second conductivity type be P-type; and the dielectric film have a layered structure of an aluminum oxide film and a silicon nitride film, with the aluminum oxide film being in contact with the first main surface.

In back-surface-electrode-type solar cells, most of the back surfaces are normally emitter layers. When the emitter layer is P-type, high photoelectric conversion efficiency can be given in a convenient way by covering the back surface with an aluminum oxide film, which is effective as P-type passivation.

It is preferable that the base layer and the emitter layer be contiguous to each other.

Such a solar cell can be easily fabricated.

It is preferable that the semiconductor substrate be provided with unevenness formed on a second main surface of the substrate.

In such a solar cell, the second main surface can have more decreased reflectance.

It is preferable that the unevenness be texture.

Such a solar cell can be easily fabricated.

The present invention further provides a photovoltaic module including the solar cell of the present invention described above built-in.

As described above, the solar cell according to the present invention can be installed in a photovoltaic module.

The present invention further provides a solar photovoltaic power generation system including the photovoltaic module of the present invention described above.

As described above, the photovoltaic module with the built-in solar cell of the present invention can be used for a solar photovoltaic power generation system.

Advantageous Effects of Invention

By the inventive method, a solar cell with high photoelectric conversion efficiency can be manufactured while largely decreasing the number of steps. This makes it possible to manufacture a back-surface-electrode-type solar cell with high photoelectric conversion efficiency at low cost. The inventive solar cell has lower contact resistance and excellent conversion efficiency.

BRIEF DESCRIPTION OF DRAWINGS

FIG. 1 are cross sectional schematic views showing an example of a method for manufacturing a back-surface-electrode-type solar cell according to the present invention;

FIG. 2 are schematic views showing an example of a method for manufacturing a back-surface-electrode-type solar cell according to the present invention;

FIG. 3 is a schematic view of a back-surface-electrode-type solar cell according to the present invention;

FIG. 4 is a cross sectional schematic view of a back-surface-electrode-type solar cell according to the present invention;

FIG. 5 is a schematic view showing an example of a photovoltaic module according to the present invention;

FIG. 6 is a schematic view of the interior of the back surface of a photovoltaic module according to the present invention, showing an example thereof;

FIG. 7 is a cross sectional schematic view showing an example of a photovoltaic module according to the present invention;

FIG. 8 is a schematic view showing an example of a solar photovoltaic power generation system according to the present invention;

FIG. 9($a$) is a flow diagram of a process for manufacturing a solar cell according to the present invention;

FIGS. 9($b$) and ($c$) are flow diagrams of conventional processes for manufacturing a solar cell;

FIG. 10 is a schematic view of a common back-surface-electrode-type solar cell according to the present invention;

FIG. 11 is a cross sectional schematic view of a common back-surface-electrode-type solar cell according to the present invention.

DESCRIPTION OF EMBODIMENTS

Hereinafter, the present invention will be described more specifically.

As described above, it has been required for a method of manufacturing a solar cell that can give high photoelectric conversion efficiency while decreasing the number of steps.

The present inventors have diligently investigated to achieve the forgoing object. As a result, the inventors have found that the foregoing object can be solved by a method for manufacturing a solar cell, including the steps of:

forming unevenness on both of main surfaces of a semiconductor substrate of a first conductivity type;

forming a base layer of the first conductivity type, having a dopant concentration higher than in the semiconductor substrate, on a first main surface of the semiconductor substrate;

forming a diffusion mask on the base layer;

removing the diffusion mask in a pattern to have a remaining diffusion mask at other than a portion where the diffusion mask have been removed;

forming an emitter layer of a second conductivity type, being an opposite conductivity type to the first conductivity type, on the portion of the first main surface where the diffusion mask have been removed;

removing the remaining diffusion mask;

forming a dielectric film on the first main surface;

forming a base electrode on the base layer; and forming an emitter electrode on the emitter layer; thereby brought the present invention to completion.

In addition, it has been required for a solar cell in which the contact resistance is decreased to improve the photoelectric conversion efficiency as described above.

The present inventors have diligently investigated to achieve the forgoing object. As a result, the inventors have found that the foregoing object can be solved by a solar cell including:

a semiconductor substrate of a first conductivity type;

a base layer of the first conductivity type, having a dopant concentration higher than in the semiconductor substrate, and an emitter layer of a second conductivity type, being an opposite conductivity type to the first conductivity type, each of the layer being provided on a first main surface of the substrate;

a dielectric film provided on the base layer and the emitter layer;

a base electrode electrically connected with the base layer; and an emitter electrode electrically connected with the emitter layer;

wherein, a surface of the semiconductor substrate is provided with unevenness formed at least at the contact interface between the base electrode and the base layer; and the first main surface has a recess in a pattern, with the surface of the recess being flat, and the emitter layer is formed on the surface of the recess; thereby brought the present invention to completion.

In the following detailed description, to understand the overall invention and show how the invention is carried out in a given specific example, many given details will be explained. However, it can be understood that the present invention can be carried out without these given details. To avoid obscureness of the present invention, a known method, a procedure, and technologies will not be described in detailed hereinafter. Although a given specific example of the present invention will be described with reference to given drawings, the present invention is not restricted thereto. The drawings described herein are schematic, and do not restrict the scope of the present invention. Further, in the drawings, for the purpose of illustration, sizes of several elements are exaggerated, and hence a scale may not be correct.

[Solar Cell]

Hereinafter, the inventive solar cell will be described by referring to the drawings, but the present invention is not limited thereto. FIG. 3 is a schematic view of a back-surface-electrode-type solar cell according to the present invention. FIG. 4 is a cross sectional schematic view of a back-surface-electrode-type solar cell according to the present invention. As shown in FIG. 4, the inventive solar cell 300 is provided with the semiconductor substrate 110 of the first conductivity type. The semiconductor substrate 110 is provided with the base layer 113 of the first conductivity type having a dopant concentration higher than that in the semiconductor substrate 110, together with the emitter layer 112 of a second conductivity type, which is an opposite conductivity type to the first conductivity type, on the first main surface. The dielectric film (back surface protective film) 144 is also provided on the base layer 113 and on the emitter layer 112. The base electrode 123 electrically connected with the base layer 113 and the emitter electrode 122 electrically connected with the emitter layer 112 are also provided.

As shown in FIG. 3, the inventive solar cell 300 is commonly provided with the base bus bar electrode (bus bar for a base electrode) 233 to further collect currents obtained from the base electrode 123 electrically connected with the base layer 113. Commonly, it is also provided with the emitter bus bar electrode (bus bar for an emitter electrode) 232 to further collect currents obtained from the emitter electrode 122 electrically connected with the emitter layer 112. The bus bar electrodes 232 and 233 are at right angles to the collecting electrodes (the emitter electrode 122, the base electrode 123) in many cases in the viewpoint of the function. It is to be noted that the locations of the bus bar electrodes and collecting electrodes are not limited to those shown in FIG. 3. The bus bar electrodes and collecting electrodes may be in a three-dimensional structure by providing the insulator film 405, for example, as shown in FIG. 2(c) that will be described later.

As shown in FIG. 1(a) that will be described later, the unevenness 169 is often formed on the second main surface of the semiconductor substrate 110 of the inventive solar cell (not shown in FIG. 4 for simplicity). As shown in FIG. 4, the second main surface is often provided with the antireflection coating 145. In such a solar cell, the reflectance of the second main surface can be decreased.

In addition to the foregoing structure, the inventive solar cell is provided with the unevenness 168 formed on the surface of the semiconductor substrate at least the contact interface between the base electrode 123 and the base layer 113 as shown in FIG. 1(h) that will be described later (not shown in FIG. 4 for simplicity). By forming the fine unevenness on the portion being in contact with the electrode of the base region as described above, it is possible to realize lower contact resistance between the base layer and the collecting electrode without opening the dielectric film. As a result, the contact resistance can be decreased to make the solar cell have improved photoelectric conversion efficiency.

In the inventive solar cell, the first main surface has a recess, the surface of which is flat (see the recess 158 in a pattern of FIG. 1(e) that will be described later), in a pattern, and the emitter layer 112 is formed on the surface of the recess. As described above, the inventive solar cell has the emitter region, the surface of which is flat and is recessed from its surroundings. The flat surface makes it possible to decrease the re-combination rate of the minority carriers on the surface, which contributes to improve the photoelectric conversion efficiency. It is to be noted that such a structure can be produced by removing the diffusion mask in a pattern, followed by forming the emitter layer after etching of the base layer at the portion where the mask have been removed as will be described later.

The height of the unevenness is not particularly limited, but can be 1 to 50 μm, for example. In the range of 1 to 50 μm, the antireflection effect becomes large, and the formation can be performed relatively easily.

Each of the unevenness 168 and 169 is preferably texture. Such a solar cell can be easily fabricated.

It is also preferable that the first conductivity type be N-type, the second conductivity type be P-type, and the dielectric film 144 have a layered structure of an aluminum oxide film and a silicon nitride film in which the aluminum oxide film is in contact with the first main surface. In back-surface-electrode-type solar cells, most of the back surfaces are normally emitter layers. When the emitter layer is P-type, high photoelectric conversion efficiency can be given in a convenient way by covering the back surface with an aluminum oxide film, which is effective as P-type passivation.

Illustrative examples of the N-type dopant include P (phosphorus), Sb (antimony), As (arsenic), and Bi (bismuth). Illustrative examples of the P-type dopant include B (boron), Ga (gallium), Al (aluminum), and In (indium).

The dopant concentration of the semiconductor substrate 110 having the first conductivity type is not particularly limited, but can be $8 \times 10^{14}$ atoms/cm$^3$ or more and $1 \times 10^{17}$ atoms/cm$^3$ or less, for example. The thickness of the semiconductor substrate 110 is not particularly limited, but can be a thickness of 100 to 300 μm, for example. The dopant concentration of the base layer 113 can be any value higher than that of the semiconductor substrate 110, but can be $1.0 \times 10^{18}$ atoms/cm$^3$ or more and $2.0 \times 10^{21}$ atoms/cm$^3$ or less, for example. The dopant concentration of the emitter layer 112 is not particularly limited, but can be $1.0 \times 10^{18}$ atoms/cm$^3$ or more and $7.0 \times 10^{20}$ atoms/cm$^3$ or less, for example.

It is also preferable that the base layer 113 and the emitter layer 112 adjoin with each other. Such a solar cell can be easily fabricated.

[Method for Manufacturing Solar Cell]

An outlined flow diagram of a process of the inventive method is shown in FIG. 9(a). Hereinafter, the inventive method for manufacturing a solar cell will be specifically described using FIG. 1 by way of an example in case of using an N-type substrate.

First, an N-type as-cut single crystal silicon substrate having plane orientation of {100} is prepared, with the specific resistance is set to 0.1 to 5 Ω·cm by doping high-purity silicon with a pentavalent element such as phosphorus, arsenic, or antimony. The single crystal silicon substrate can be prepared by either a CZ method or an FZ method. The substrate does not necessarily have to be a single crystal silicon, but may be a polycrystalline silicon.

Subsequently, each fine unevenness 168 and 169 called texture is formed on both of the main surface of the semiconductor substrate 110 as shown in FIG. 1(a). The texture is an effective means to decrease the reflectance of a solar cell. The texture can be formed by immersion into heated solution of alkali such as sodium hydroxide, potassium hydroxide, potassium carbonate, sodium carbonate, and sodium hydrogencarbonate (concentration: 1 to 10%, temperature: 60 to 100° C.) for about 10 minutes to 30 minutes. The foregoing solution may be mixed with a certain amount of 2-propanol to enhance the reaction.

The semiconductor substrate 110 subjected to texture formation as described above is cleaned in acidic aqueous solution including hydrochloric acid, sulfuric acid, nitric acid, hydrofluoric acid, or mixture thereof. It is also possible to mix hydrogen peroxide to improve the cleanliness.

Then, on the first main surface of this semiconductor substrate 110, the base layer 113 is formed as shown in FIG. 1(b). In forming the base layer 113, a vapor-phase diffusion method with phosphorus oxychloride can be used. A phosphorus diffusion layer (an layer) to be the base layer 113 is formed on the first main surface by placing two substrates, being stacked with each other as a pair, in a thermal treatment furnace, followed by subjecting the semiconductor substrates 110 to thermal treatment at 830 to 950° C. in a mixed gas atmosphere of phosphorus oxychloride, nitrogen, and oxygen. In addition to the vapor-phase diffusion method, the base layer can be formed by a method of spin coating or printing of phosphorus-containing material, followed by thermal treatment.

It is to be noted that the base layer 113 is preferably formed on the entire surface of the first main surface in the step of FIG. 1(b). Such a method for manufacturing a solar cell can easily manufacture a solar cell in which the base layer and the emitter layer are contiguous to each other.

After forming the base layer 113, the diffusion masks (alias: barrier film, hereinafter also referred to as a "mask" simply) 156 are formed on both of the main surfaces as shown in FIG. 1(c) for the emitter layer formation of the next step. As the diffusion mask 156, a silicon oxide film or a silicon nitride film can be used. When a CVD method is used, any film can be formed by appropriately selecting the type of the gas to be introduced. A silicon oxide film also can be formed by thermal oxidation of the semiconductor substrate 110. A silicon thermal oxide film of about 100 to 250 nm can be formed by subjecting the semiconductor substrate 110 to thermal treatment in an oxygen atmosphere at 950 to 1100° C. for 30 minutes to 4 hours, for example. This thermal treatment may be performed subsequent to the thermal treatment for forming the base layer 113 in the same batch therewith.

Next, the mask is opened at a portion to be an emitter region (mask opening 157) as shown in FIG. 1(d). Specifically, it is opened in shapes of parallel lines with the opening width of 400 to 1150 µm repeated at about 0.6 to 2.0 mm. The opening method may include any of chemical methods such as a photolithography method and a method by using etching paste as well as physical methods by using laser or a dicer. It is also possible to use a composite method in which the portion with large area is opened with etching paste, and the details are opened with laser.

Subsequent to opening the mask, the semiconductor substrate 110 may be dipped into aqueous solution containing alkali such as KOH and NaOH in high concentration (preferably in a concentration higher than the concentration when the texture is formed, e.g., 10 to 30%, preferably 20 to 30%) heated to 50 to 90° C. for 1 to 30 minutes as shown in FIG. 1(e), thereby removing (etching) the unnecessary base layer disposed at the opening 157. That is, it is preferable to etch the surface of the semiconductor substrate at the portion where the diffusion mask have been removed (the mask opening 157) after the step of FIG. 1(d) and before the step of forming an emitter layer shown in FIG. 1(f) that will be described later. The conversion efficiency is improved by forming the emitter layer after etching the base layer at the opening (the portion where the mask have been removed) as described above. It is to be noted that the temperature of the aqueous alkaline solution in the step of FIG. 1(e) is also preferable to be higher than that in forming the texture. The etching portion tends to be flat by etching the surface of the semiconductor substrate with high-temperature and high-concentration aqueous alkaline solution.

The diffusion mask 156 also functions as a mask for alkali etching in this step (FIG. 1(e)). Through the etching, a recess (the recess 158 in a pattern) is formed on the substrate surface as in FIG. 1(e). The depth of the recess is determined by the depth of the base layer, and is about 0.5 to 10 µm. Removal of the N-type dopant at the opening makes it easier to control the dopant concentration of the emitter layer. Also on the light-receiving surface, a mask have been formed, thereby eliminating the risk of etching the texture on the light-receiving surface.

It is to be noted that the position (height) of the recess 158 in a pattern can be a lower (deeper) position than the standard position, which is based on the position of the recess of the back surface unevenness 168, as shown in FIG. 1(e). The flatness of this recess 158 in a pattern can be less than 1 µm in a PV value (the difference between the maximum and the minimum of the displacement), for example.

Then, the emitter layer 112 is formed on the opening as shown in FIG. 1(f). The emitter layer has an opposite conductivity type (P-type in this case) to the semiconductor substrate 110, and the thickness is about 0.05 to 1 µm. The emitter layer 112 can be formed by vapor-phase diffusion using $BBr_3$ or the like. The semiconductor substrate 110 is placed in a thermal treatment furnace and subjected to thermal treatment at 950 to 1050° C. while introducing mixed gas of $BBr_3$ and oxygen. As the carrier gas, nitrogen or argon is suitable. This can be formed by a method of applying a coating agent containing boron source onto the first main surface followed by thermal treatment at 950 to 1050° C. As the coating agent, it is possible to use aqueous solution containing 1 to 4% of boric acid as boron source and 0.1 to 4% of polyvinylalcohol as a thickener, for example. On the light-receiving surface, a mask has been formed, thereby eliminating the risk of auto doping of boron to the light-receiving surface during the thermal treatment. Since the following steps do not need a mask, there is no need to oxidize the substrate unnecessarily or to perform excess film deposition. That is, the film thickness of a silicon oxide film on the emitter layer 112 may be 95 nm or less at the end of the thermal treatment for forming the emitter layer. It is to be noted that, after the etching step (FIG. 1(e)), the emitter layer 112 is formed on the surface of the recess as in FIG. 1(f).

After forming the diffusion layer, the diffusion mask 156 and glass formed on the surface are removed by hydrofluoric acid or the like (see FIG. 1(f)).

Subsequently, the dielectric film 144 is formed on the first main surface of the semiconductor substrate 110 as shown in FIG. 1(g). The antireflection coating 145 may be formed on the second main surface as a step performed simultaneously, previously, or subsequently thereto.

As the antireflection coating 145 on the second main surface, a silicon nitride film or a silicon oxide film can be used. In an instance of the silicon nitride film, a film of about 100 nm is formed by using a plasma CVD apparatus. As the reaction gas, mixed gas of monosilane ($SiH_4$) and ammonia ($NH_3$) is often used, but nitrogen can be used instead of the $NH_3$. The reaction gas may be mixed with hydrogen to control the process pressure, to dilute the reaction gas, or to accelerate the bulk passivation effect of a substrate when a polycrystalline silicon is used as the substrate. The silicon oxide film can be formed by a CVD method, but the film formed by a thermal oxidation method achieves higher properties. In order to improve the effect for protecting the surface, the silicon nitride film or the silicon oxide film may be formed after forming an aluminum oxide film on the substrate surface previously.

The dielectric film 144 of a silicon nitride film or a silicon oxide film can be utilized for the first main surface as a surface protective film. The dielectric film 144 preferably has a film thickness of 50 to 250 nm. As on the second main surface (the light-receiving surface), the silicon nitride film can be formed by a CVD method, and the silicon oxide film can be formed by a thermal oxidation method or a CVD method. When the substrate is N-type as in this instance, the silicon nitride film or the silicon oxide film can be formed onto the substrate surface that has a previously formed aluminum oxide film, which is effective as a passivation of a P-type layer. In the method of FIG. 1, for example, the step of FIG. 1(g) may be a step of forming an aluminum oxide film so as to cover the base layer 113 and the emitter layer 112, followed by forming the silicon nitride film on the aluminum oxide film. In back-surface-electrode-type solar cells, most of the back surfaces are normally emitter layers. When the emitter layer is P-type, high photoelectric conversion efficiency can be given in a convenient way by covering the back surface with an aluminum oxide film, which is effective as P-type passivation. It is to be noted that the aluminum oxide film is also formed on the base (N-type) layer in this case, but this degradation of the properties due to this is slight since most of the surface is an emitter (P-type) layer.

Then, the base electrode 123 is formed on the base layer 113 by screen printing method, for example, as shown in FIG. 1(h). For example, Ag paste in which Ag powder and glass frit have been mixed with organic binder is printed on the base layer 113 by using a previously prepared plate having a pattern of parallel lines with the opening width of 30 to 100 μm and the interval of 0.6 to 2.0 mm. In the same way, Ag paste is printed as the emitter electrode 122 on the emitter layer 112. The Ag paste for a base electrode and the Ag paste for an emitter electrode may be the same or different. In the contact portion of the emitter electrode and the substrate, the protective film on the first main surface may have been removed previously in order to decrease the contact resistance. In the step of removing the protective film, laser or etching paste can be used. It is to be noted that this removal of the protective layer is not essential because texture is formed on the contact portion of the base electrode and the substrate.

After the foregoing electrode printing, thermal treatment (firing) is performed to promote sintering of the electrode, together with electrical connection between the substrate and the electrode. The firing is commonly performed by treating at a temperature of 700 to 850° C. for 1 to 5 minutes.

It is to be noted that the electrode for a base layer and the electrode for an emitter layer can be also fired separately.

Subsequently, the step of forming a bus bar electrode will be described by reference to FIG. 2. FIG. 2(a) is a top view of the semiconductor substrate 110 after the step of FIG. 1(h). The emitter electrode 122 and the base electrode 123 are formed on an emitter region (the emitter layer 112) and a base region (the base layer 113) respectively. Onto this semiconductor substrate 110, insulator material (which is cured to be the insulator film 405) is applied in a pattern. At this stage, the coating may be performed in a pattern like FIG. 2(b), for example, so as not to electrically connect an N-bus bar (in this case, the base bus bar electrode to connect with the base electrode) with the emitter electrode, and not to electrically connect a P-bus bar (in this case, the emitter bus bar electrode to connect with the emitter electrode) with the base electrode. The coating can be performed by screen printing or the like. Illustrative examples of the insulator material include a material that contains one or more resin selected from silicone resin, polyimide resin, polyamideimide resin, fluororesin, phenol resin, melamine resin, urea resin, polyurethane, epoxy resin, acrylic resin, polyester resin, and poval resin. The foregoing insulator material is applied by using screen printing, for example, and then cured at 100 to 400° C. for about 1 to 60 minutes.

Lastly, the base bus bar electrode 233 and the emitter bus bar electrode 232 are formed to make a structure shown in FIG. 2(c) in which the N-bus bar (the base bus bar electrode) 233 is connected with the base electrode 123, the P-bus bar (the emitter bus bar electrode) 232 is connected with the emitter electrode 122, and insulator layers are each interposed between the N-bus bar 233 and the emitter electrode 122 as well as between the P-bus bar 232 and the base electrode 123. For the bus bar electrode, low-temperature curing electrical-conductive paste can be used. Specific examples thereof include a material that contains one or more electrical conductive material selected from Ag, Cu, Au, Al, Zn, In, Sn, Bi, and Pb, together with one or more resin selected from epoxy resin, acrylic resin, polyester resin, phenol resin, and silicone resin. Such material is applied in a pattern by using a screen printing method or dispenser, for example, followed by curing at 100 to 400° C. for about 1 to 60 minutes. When the number of the bus bars is increased, the interval between the adjacent bus bars can be shortened, which makes it possible to thin the finger electrode to reduce the cost of the material of the finger electrode. The number of bus bars, which can be determined based on tradeoff between an increase of the material cost due to the increase of the number of bus bars and a decrease of the material cost due to the thinning of the finger electrode, is preferably 4 to 20.

By the inventive method shown in FIG. 1 and FIG. 9 (a) described above, the number of steps can be decreased compared to that of the conventional methods shown in FIGS. 9(b) and (c). The foregoing has described an instance in which the substrate is N-type, but the inventive method can be applied to the case in which the substrate is P-type. That is, a P-type layer as the base layer and an N-type layer as the emitter layer may be provided. The P-type layer can be formed by using thermal diffusion of boron described above. After the thermal diffusion, glass is formed on the surface of the substrate. The glass is preferably not to be removed, particularly when the base layer is P-type and the mask formation of the succeeding step is performed by thermal oxidation, before the thermal oxidation. That is, when the first conductivity type is P-type, and the second conductivity type is N-type, it is preferable that the glass layer is formed on the first main surface simultaneously with forming the base layer 113 in the step of FIG. 1(*b*), and the diffusion mask is formed on the base layer 113 while leaving the glass layer in the step of FIG. 1(*c*). In this case, the step of removing the glass layer is not performed, and the number of steps is not increased. The substrate can be kept to have high minority carrier lifetime by forming the diffusion mask while leaving the glass layer, which is formed simultaneously with the formation of the P-type conductivity type layer as the base layer. This is probably due to gettering effect given by the glass layer. When the base layer is P-type, the base (P-type) layer is formed on a portion where texture have been formed, which makes it possible to realize lower contact resistance without removing the protective film. That is, when the first conductivity type is P-type and the second conductivity type is N-type, the base electrode 123 and the emitter electrode 122 may be formed after forming the dielectric film 144 without removing the dielectric film 144 in the inventive method.

The inventive method can eliminate the step of forming a mask only at one side as described above, thereby making it possible to manufacture a solar cell at lower cost compared to the method of Patent Document 3. In the solar cell of the Patent Document 3, the emitter layer 112 protrudes over the base layer 113; the inventive method can manufacture a solar cell in which the base layer 113 protrudes over the emitter layer 112 as shown in FIG. 1 (*h*). That is, in a solar cell having a structure shown in FIG. 1(*h*), the semiconductor substrate 110 has a thicker thickness at the region where the base layer 113 has been formed than the thickness at the region where the emitter layer 112 has been formed. When the base layer is formed on the recess as in Patent Document 3, a printing plate cannot be close contact with the substrate (the base region) in forming the base electrode by screen printing method, making the electrode material get into the gap between the plate and the substrate to make the electrode thick. In the inventive method, the plate and can be contact with the substrate completely since the base region has protruded, thereby eliminating the problem of thickening the base electrode. Such a solar cell having a structure shown in FIG. 1(*h*) can be manufactured by fewer number of steps compared to the solar cell of Patent Document 3. This makes it possible to decrease the occasions of contamination in the manufacturing thereof to keep the minority carrier lifetime of the substrate high. Accordingly, the inventive solar cell is excellent in conversion efficiency. Specifically, the minority carrier lifetime of the substrate, which is between 300 and 600 μs in Patent Document 3, can be improved by the inventive method to 500 to 900 μs.

The solar cell manufactured by the foregoing method can be used for fabricating a photovoltaic module. FIG. 5 shows a schematic view of an example of the photovoltaic module including a built-in solar cell manufactured by the foregoing method. The photovoltaic module 560 has a tiled structure to cover the interior with the solar cells 500 manufactured by the foregoing method.

In the photovoltaic module 560, several to several tens of the contiguous solar cells 500 are electrically connected with each other in series to constitute a series circuit called string. The schematic view of the string is shown in FIG. 6. FIG. 6 corresponds to a schematic view of the interior of the module at the back side, which is not exposed usually. This does not show the finger electrodes and bus bar electrodes. In order to electrically connect in series, P-bus bars (the bus bar electrodes connected with the finger electrodes that is connected with the P-type layer of the substrate) and N-bus bars (the bus bar electrodes connected with the finger electrodes that is connected with the N-type layer of the substrate) of the contiguous solar cells 500 are connected with each other through the lead wires 561, etc. as shown in FIG. 6.

A cross sectional schematic view of the photovoltaic module 560 is shown in FIG. 7. As described above, the string is constituted by connecting the lead wires 561 to the bus bar electrodes 732 to connect a plurality of the solar cells 500. The string is commonly encapsulated with the translucent filler 772 such as EVA (ethylene/vinyl acetate). The non-light-receiving surface is covered with the weather-resistant resin film 773 such as a PET (polyethylene terephthalate) film, and the light-receiving surface is covered with the light-receiving surface protective material 771 with translucency and high mechanical strength such as soda-lime glass. As the filler 772, polyolefin, silicone, and so on can be used in addition to EVA described above.

This photovoltaic module can be used for fabricating and constituting a solar photovoltaic power generation system. FIG. 8 shows a basic constitution of a solar photovoltaic power generation system in which the inventive modules are connected. A plurality of the photovoltaic modules 16 are electrically connected with the wiring 15 in series to supply generated power to the external load circuit 18 through the invertor 17. The system may be also provided with a secondary battery, although which is not shown in FIG. 8, to store the generated power.

EXAMPLE

Hereinafter, the present invention will be described in more specifically by showing Examples and Comparative Example, but the present invention is not limited the following Examples.

Example 1

Solar cells were manufactured by using the inventive method.

First, eight pieces of N-type as-cut silicon substrates with the plane orientation of {100} doped with phosphorus having a thickness of 200 μm and a specific resistance of 1 Ω·cm were prepared. Each of these silicon substrate was subjected to dipping into 2% aqueous potassium hydroxide/2-propanol solution at 72° C. to form textures onto the both surfaces of the substrate, and then cleaned in mixed solution of hydrochloric acid/hydrogen peroxide heated to 75° C. (see FIG. 1(*a*)).

Subsequently, the substrates were subjected to thermal treatment at 870° C. for 40 minutes in a phosphorus oxychloride atmosphere, with the light-receiving surfaces being stacked with each other to form phosphorus diffusion layers (base layers) (see FIG. 1(*b*)). The sheet resistivity of the base layer was measured by four-point probe method to be 15Ω.

This was subjected to thermal oxidation at 1000° C. for 3 hours in an oxygen atmosphere to form masks (see FIG. 1(*c*)).

The mask on the back surface was opened with laser (see FIG. 1(*d*)). As the laser source, second harmonic of Nd:YVO$_4$ was used. The opening pattern was set to a shape of belts having a width of about 1 mm repeated at 1.2 mm.

This was dipped into aqueous KOH solution with the concentration of 24% at 80° C. to remove the base layer at the openings (see FIG. 1(*e*)).

Then, the substrates were placed in a thermal treatment furnace with the two pieces thereof being stacked with each other as a pair, and were subjected to thermal treatment at 1000° C. for 10 minutes, while introducing a mixed gas of BBr$_3$, oxygen, and argon. In this way, an emitter layer was formed (see FIG. 1(f)). After that, dipping to hydrofluoric acid with the concentration of 25% was performed to remove the surface glass and the masks.

Subsequently to the foregoing treatment, aluminum oxide films and silicon nitride films were formed on the both surfaces as dielectric films by using a plasma CVD apparatus (see FIG. 1(g)). That is, the dielectric film had a layered structure of the aluminum oxide film and the silicon nitride film, with the aluminum oxide film being in contact with the first main surface (hereinafter, this layered structure is referred to as an "aluminum oxide/silicon nitride film"). The film thicknesses of the aluminum oxide film and the silicon nitride film were respectively 10 nm and 100 nm on each of the front surface and the back surface. After that, the aluminum oxide/silicon nitride film was opened only at the regions to be in contact with emitter electrodes by using laser.

Next, Ag paste was printed by using a screen printing machine on the base layer and dried; on the emitter layer, it was printed along the opening regions of the aluminum oxide/silicon nitride film and dried (see FIG. 1(h)). This was fired in an air atmosphere at 780° C. In this way, base electrodes and emitter electrodes were formed on the base layer and the emitter layer respectively as collecting electrodes (finger electrodes).

Onto this substrate, insulator material was printed in a pattern by using a screen printing machine. As the insulator material, silicone manufactured by Shin-Etsu Chemical Co., Ltd. was used. This was cured in a belt furnace at 200° C. for 5 minutes.

Lastly, low-temperature curing Ag paste was printed in a shape of six lines so as to intersect to the finger electrodes that had been already fabricated at right angles by using a screen printing machine, and then cured in a belt furnace at 300° C. for 30 minutes to form bus bars.

Example 2

Solar cells were manufactured by the same method as in Example 1 up to the laser opening and from the step of boron diffusion without performing the step of dipping to aqueous KOH solution at 80° C.

Example 3

The same treatment as in Example 1 was performed up to the laser opening and the step of dipping to aqueous KOH solution at 80° C. Subsequently, thermal treatment was performed at 1000° C. for 10 minutes in an atmosphere of a mixed gas of BBr$_3$, oxygen, and argon, with the light-receiving surfaces being stacked with each other, followed by oxidation treatment at 1000° C. in an oxygen atmosphere to form a boron diffusion layer and 100 nm of a silicon oxide film at the openings. From the step of removing the surface glass by dipping into 25% hydrofluoric acid, the same procedure as in Example 1 was performed.

Example 4

The inventive method was applied to P-type silicon substrates with the plane orientation of {100} doped with boron. Texture was formed on the both surfaces of the substrate and cleaned. Then, the substrates were placed in a thermal treatment furnace with the two pieces thereof being stacked with each other as a pair, and were subjected to thermal treatment at 1000° C. for 10 minutes, while introducing a mixed gas of BBr$_3$, oxygen, and argon, followed by thermal oxidation at 1000° C. for 3 hours in an oxygen atmosphere to form masks.

The mask on the back surface was opened with laser, and the boron diffusion layer at the openings was removed by dipping into aqueous KOH solution.

Subsequently, thermal treatment was performed at 870° C. for 40 minutes in a phosphorus oxychloride atmosphere to form phosphorus diffusion layer at the openings.

The surface glass was removed by dipping into hydrofluoric acid, and then silicon nitride films were formed on the both surfaces.

The step of forming electrodes was performed in the same way as in Example 1.

Example 5

The same treatment as in Example 4 was performed up to the formation of silicon nitride films on the both surfaces. Subsequently, the electrodes were formed without opening the silicon nitride film at the regions to be in contact with emitter electrodes when forming the electrodes.

Comparative Example

For comparison, solar cells without having texture on the surface of each base layer were manufactured.

First, slice damage on the substrate was etched with 25% aqueous KOH solution at 70° C. After cleaning, about 50 nm of a silicon nitride film was formed as a texture mask on the one side only, using a CVD apparatus.

After forming the texture in the same way as in Examples, the silicon nitride film was removed with 25% aqueous hydrofluoric acid solution, followed by cleaning. It was observed that the texture was formed on the only one side by visual inspection. After the step of phosphorus oxychloride diffusion, the same procedure as in Example 1 was performed.

On the solar cell samples of Examples 1 to 5 and Comparative Example obtained as described above, current-voltage characteristics were measured under the conditions of spectrum: AM1.5, light intensity: 100 mW/cm$^2$, and 25° C. by using a solar simulator manufactured by Yamashita Denso Corporation to determine photoelectric conversion efficiency. The average values of the obtained results are shown in Table 1.

TABLE 1

| | Photoelectric conversion efficiency (%) | Short-circuit current (mA/cm$^2$) | Open circuit voltage (mV) | Fill factor (%) |
|---|---|---|---|---|
| Example 1 | 22.5 | 40.9 | 682 | 80.7 |
| Example 2 | 22.3 | 40.8 | 678 | 80.6 |
| Example 3 | 22.5 | 41.0 | 684 | 80.2 |
| Example 4 | 22.2 | 40.6 | 680 | 80.4 |
| Example 5 | 22.3 | 40.6 | 682 | 80.5 |
| Comparative Example | 21.6 | 40.3 | 675 | 79.4 |

As shown in Table 1, Example 1, in which the number of steps was decreased, showed higher conversion efficiency compared to that of Comparative Example. Having the texture under the base electrodes, the contact resistance between the base layer and the electrodes was improved, and the fill factor was higher. Another reason will be that the occasions of contamination was decreased due to the decrease of the number of steps, thereby improving the lifetime.

The conversion efficiency of Example 2 was equivalent to that of Example 1. High conversion efficiency can be achieved even without etching after the opening.

The conversion efficiency of Example 1 was equivalent to that of Example 3. The conversion efficiency is not lowered even when the thickness of the oxide film is thin after forming the emitter layer.

Example 4 showed higher conversion efficiency compared to that of Comparative Example. The inventive method makes it possible to bring higher conversion efficiency also in a P-type substrate.

The conversion efficiency of Example 5 was equivalent to that of Example 4. When the substrate is P-type, low contact resistance and high conversion efficiency can be achieved without opening the back surface protective film, due to the texture at the contact portions of the base electrodes.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A solar cell comprising:
a semiconductor substrate of a first conductivity type;
a base layer of the first conductivity type, having a dopant concentration higher than in the semiconductor substrate, and an emitter layer of a second conductivity type which is an opposite conductivity type to the first conductivity type, each of the layer being provided on a first main surface of the substrate;
a dielectric film provided on the base layer and the emitter layer;
a base electrode electrically connected with the base layer; and
an emitter electrode electrically connected with the emitter layer;
wherein, a surface of the semiconductor substrate is provided with unevenness formed at least at the contact interface between the base electrode and the base layer;
the first main surface has a recess in a pattern, with the surface of the recess being flat, and the emitter layer is formed on the surface of the recess; and
flatness of the recess is less than 1 μm in a PV value.

2. The solar cell according to claim 1, wherein the first conductivity type is N-type, and the second conductivity type is P-type; and the dielectric film has a layered structure of an aluminum oxide film and a silicon nitride film, with the aluminum oxide film being in contact with the first main surface.

3. The solar cell according to claim 2, wherein the base layer and the emitter layer are contiguous to each other.

4. The solar cell according to claim 3, wherein the semiconductor substrate is provided with unevenness formed on a second main surface of the substrate.

5. The solar cell according to claim 2, wherein the semiconductor substrate is provided with unevenness formed on a second main surface of the substrate.

6. The solar cell according to claim 1, wherein the base layer and the emitter layer are contiguous to each other.

7. The solar cell according to claim 6, wherein the semiconductor substrate is provided with unevenness formed on a second main surface of the substrate.

8. The solar cell according to claim 1, wherein the semiconductor substrate is provided with unevenness formed on a second main surface of the substrate.

9. The solar cell according to claim 1, wherein the unevenness is texture.

10. A photovoltaic module comprising the solar cell according to claim 1 built-in.

11. A solar photovoltaic power generation system comprising the photovoltaic module according to claim 10.

* * * * *